United States Patent [19]

Saitou et al.

[11] Patent Number: 5,786,025
[45] Date of Patent: Jul. 28, 1998

[54] BA AND/OR SR TITANATE FILMS BY ORGANIC CHEMICAL VAPOR DEPOSITION

[75] Inventors: Norimiti Saitou; Hiroto Uchida; Katsumi Ogi, all of Omiya, Japan

[73] Assignee: Mitsubishi Materials Corporation, Tokyo, Japan

[21] Appl. No.: 709,596

[22] Filed: Sep. 9, 1996

[30] Foreign Application Priority Data

Sep. 7, 1995 [JP] Japan .................................. 7-230452

[51] Int. Cl.$^6$ .............................. B05D 5/12; C23C 16/30
[52] U.S. Cl. .......................................... 427/99; 427/255.3
[58] Field of Search .................................... 427/99, 255.3

[56] References Cited

U.S. PATENT DOCUMENTS

| | | | |
|---|---|---|---|
| 5,006,363 | 4/1991 | Fujii et al. | 427/39 |
| 5,372,850 | 12/1994 | Uchikawa et al. | 427/255.3 |
| 5,406,445 | 4/1995 | Fujii et al. | 361/305 |
| 5,442,585 | 8/1995 | Eguchi et al. | 365/149 |
| 5,459,635 | 10/1995 | Tomozawa et al. | 361/321.5 |
| 5,518,536 | 5/1996 | Doellein | 106/1.25 |
| 5,555,154 | 9/1996 | Uchikawa et al. | 361/322 |
| 5,596,214 | 1/1997 | Endo | 257/324 |

FOREIGN PATENT DOCUMENTS

| | | |
|---|---|---|
| 1035995 | 10/1989 | China . |
| 257246 | 6/1988 | German Dem. Rep. . |
| 62-252238 | 11/1987 | Japan . |
| 4-157158 | 5/1992 | Japan . |
| 7-86270 | 3/1995 | Japan . |
| 2024433 | 12/1994 | Russian Federation . |
| 1065343 | 1/1984 | U.S.S.R. . |
| 1693847 | 7/1994 | U.S.S.R. . |

OTHER PUBLICATIONS

CAPLUS accession No. 1972:53842, Vasil'eva et al, Zh. Prikl. Khim., vol. 44, No. 10, pp. 2157–2161, 1971.
CAPLUS accession No. 1981:24182, Hubicki et al, Ann. Univ. Mariae Curie–Sklodowska, Sect. AA: Phys. Chem., vol. date 197601977, 31–32, 85–91, 1980.
CAPLUS accession No. 1981:40570, Hubicki et al, Ann. Univ Mariae Curie–Sklodowska, Sect. AA: Phys. Chem., vol. date 1976–1977, 31–32, 99–105, 1980.
CAPLUS accession No. 1987:148238, Sadokhina et al, Ah. Prikl. Khim., vol. 59, No. 12, pp. 2679–2683, 1986.
CAPLUS accession No. 1993:542188, Kabayashi, Nippon Kagaku Kaishi, vol. 7, pp. 897–900, 1993.
CAPLUS accession No. 1994:150868, Yamaguchi et al, Jpn. J. Appl. Phys., Part 1, vol. 32, No. 9B, pp. 4069–4073, 1993.
CAPLUS accession No. 1996:161863, Lee et al, Mater. Res. Soc. Symp. Proc., 415, pp. 183–188, 1996.
Li et al., "Separation of barium and strontium by ion exchange–preparation of high–purity low–strontium barium carbonate," Lizi, Jiaohuan Yu Xifu, vol. 8, No. 3, pp. 247–251, 1992.

*Primary Examiner*—Robert E. Sellers
*Attorney, Agent, or Firm*—Oblon, Spivak, McClelland, Maier & Neustadt, P.C.

[57] ABSTRACT

High-purity $MTiO_3$ (M=Sr and/or Ba)-type dielectric thin films with improved electric characteristics, particularly leakage currents and dielectric breakdown voltages, are prepared by MOCVD. Either or both a high-purity bis (β-diketonato) Sr and Ba complexes, which each contain 1 ppm or less of each alkali metal and an alkaline earth metal as impurity metals, are used as the metal M supply sources. The high-purity volatile complexes are prepared by heat decomposition Sr or Ba nitrate (or acetate), which has been purified by a combination of recrystallization and ion-exchange chromatography, to contain 1 ppm or less of each alkali metal and alkaline earth metal as impurity metals, to thereby prepare high-purity SrO or BaO. The SrO or BaO is then reduced to high-purity metallic Sr or Ba by the thermit process, and then the metallic Sr or Ba is reacted with a β-diketone to form the bis(β-diketonato) complexes.

3 Claims, No Drawings

BA AND/OR SR TITANATE FILMS BY ORGANIC CHEMICAL VAPOR DEPOSITION

BACKGROUND OF THE INVENTION

1. Field of the Invention

The present invention relates to a method of preparing dielectric thin films for use in semiconductor devices, etc. by metal organic chemical vapor deposition (MOCVD). More specifically, the present invention is concerned with a method of preparing high-performance $MTiO_3$ (M=Ba and/or Sr)-type dielectric thin films with smaller leakage currents and greater dielectric breakdown voltages, by using a highly-purified barium and/or strontium-containing vapor-deposition material. The present invention also relates to the high-purity vapor-deposition material itself and a method of preparing the material.

2. Description of the Background

Dielectric thin films with perovskite-type crystal structures represented by the general formula $MTiO_3$ (M=Ba and/or Sr) have been used in semiconductor devices, etc., for example, as capacitor films of DRAMs. Such dielectric thin films can be formed by a variety of methods for forming thin films, including sputtering and sol-gel methods. Among these various methods, MOCVD is preferred for preparing high-performance dielectric thin film because the composition is easily controlled, variations in the composition are minimized, and the step coverage (coverage of stepped substrates) is excellent.

Titanium alkoxides, such as tetraisopropoxy titanium, can be used as a Ti supply source for dielectric thin films of the general formula $MTiO_3$, by MOCVD. Since alkoxides of Ba and Sr have low volatility, most of the supply sources of these metals are β-diketone complexes, which are adducts of β-diketone compounds such as dipivaloylmethane, $(CH_3)_3CCO—CH_2—COC(CH_3)_3$ (dpmH) or hexafluoroacetylacetone, $CF_3CO—CH_2—COCF_3$. (hfacH). The β-diketone complexes which are provided by addition of dpmh or hfach to Sr or Ba include bis(dipivaloylmethanato) strontium or barium ($Sr(dpm)_2$ or $Ba(dpm)_2$) and bis(hexafluoroacetylacetonato) strontium or barium ($Sr(hfac)_2$ or $Ba(hfac)_2$) represented by the following formulae (1) and (2), respectively:

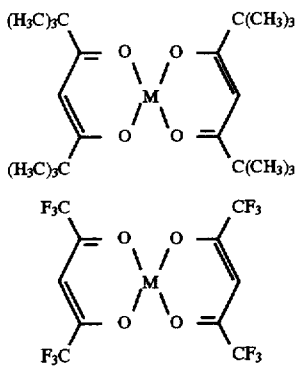

wherein M is Sr or Ba.

These β-diketone complexes are obtained by reacting metallic Sr or Ba with dpmH or hfacH in an organic solvent. As is well known, metallic Sr or Ba are prepared by reducing the oxide (SrO or BaO) with aluminum while heating; the oxide is prepared by heat decomposition of a Sr or Ba compound such as a nitrate, carbonate or acetate.

$MTiO_3$-type dielectric thin films which have been prepared by MOCVD have poor electric characteristics, such as a leakage current of $10^{-7}$ A/cm$^2$, a relative dielectric constant of 150 and a dielectric breakdown voltage of 1,100 kV/cm$^2$ for a film thickness of 3,000 Å, in the case of films of strontium titanate ($SrTiO_3$); and a leakage current of $10^{-7}$ A/cm$^2$, a relative dielectric constant of 300 and a dielectric breakdown voltage of 1,000 kV/cm$^2$ for a film thickness of 3,000 Å, in the case of strontium barium titanate ($Ba_xSr_{1-x}TiO_3$), all in rounded values. Thus, there is a great demand for improved properties, in particular smaller leakage currents and larger dielectric breakdown voltages.

It is known that leakage currents and dielectric breakdown voltages of dielectric thin films are related to the film purities. In order to ensure good electric characteristics (dielectric characteristics) of dielectric thin films, it is necessary to subject the formed films to heat treatment to increase the film crystallinity. The heat treatment is usually performed at a temperature of 600° C. or higher. The heat treatment not only increased crystallinity, but also growth of the crystal grains, causing precipitation of impurities of the grain boundary. The metallic impurities precipitated in the grain boundary in turn cause a larger leakage current and a smaller dielectric breakdown voltage.

Accordingly, a decrease in the content of impurities, particularly metallic impurities, of the dielectric thin films results in an improvement in both the leakage current and the dielectric breakdown voltage characteristics. In order to reduce the impurities content, the purity of the vapor deposition materials must be increased.

Titanium alkoxides, which are chemically stable and have vapor pressure characteristics and solubilities in organic solvents which are somewhat different from those of alkoxides of impurity metals, can be easily purified to an individual impurity metal contents of 1 ppm or less by recrystallization, distillation and/or sublimation, which all are conventional methods of purifying organic compounds. In contrast, the Sr or Ba β-diketone complex, particularly $Sr(dpm)_2$ or $Ba(dpm)_2$, is chemically unstable and tends to form a non-volatile compound through absorption of water, carbon dioxide or the like in the air. Therefore, previously, these complexes have been synthesized by mixing metallic strontium or barium with a β-diketone, compound such as dipivaloylmethane, in a completely water-free organic solvent, purified by sublimation, and used.

Investigation by the present inventors on the purities of $Sr(dpm)_2$ and $Ba(dpm)_2$, however, has revealed that a total of approximately 100 ppm or more of alkali metals (Li, Na and K) and alkaline earth metals (Mg, Ca and Ba or Sr) are present as metallic impurities. Since all these impurity metals form complexes (e.g., Na(dpm) and Ca(dpm)$_2$) with dpmH, and all the complexes are volatile, the complexes volatilize during the formation of the films by MOCVD and mix into the formed dielectric thin films. These metallic impurities are believed to be the leading cause of impairment of the electric characteristics, particularly the leakage current and the dielectric breakage voltage, of the $MTiO_3$-type dielectric thin films prepared by MOCVD.

Since the β-diketone complexes of Sr and Ba, such as $Sr(dpm)_2$ and $Ba(dpm)_2$, are so chemically unstable, easily producing non-volatile compounds, and the vapor pressure characteristics and solubilities in organic solvents of Na(dpm) and Ca(dpm)$_2$ are close to those of $Sr(dpm)_2$ and $Ba(dpm)_2$, the individual impurity metals cannot be completely removed by any of the conventional methods, such as sublimation and recrystallization. Thus, purification cannot be accomplished, such that the individual metallic impurity contents are as low as 1 ppm or less. This also applies to the case where the β-diketone is hfacH.

SUMMARY OF THE INVENTION

An object of the present invention is to provide a method of preparing high-purity $MTiO_3$-type dielectric thin films with improved electric characteristics, particularly improved leakage currents and dielectric breakage voltages, by MOCVD.

Another object of the present invention is to provide a high-purity strontium or barium β-diketone complex which are useful as a vapor deposition material for preparation of MTiO$_3$-type dielectric thin films by MOCVD, a method of preparing the complexes, and a method of preparing the raw materials necessary for the preparation.

After repeated investigation by the present inventors it has now been found that metallic impurities, such as alkali metals and alkaline earth metals, which are present in the strontium or barium β-diketone complex as a vapor deposition material result from the metallic strontium or barium used for preparation of the complex. Furthermore, the impurity metals in the metallic strontium or barium are effectively removed by purifying the strontium or barium compound, which is the ultimate starting material for preparation of the metallic strontium or barium, by a combination of recrystallization and ion-exchange chromatography.

The objects of the invention are provided by a method of preparing high-purity dielectric thin films with perovskite-type crystal structures represented by the general formula: MTiO$_3$ wherein M is Ba and/or Sr, by metal organic chemical vapor deposition, comprising:

using either or both a high-purity strontium β-diketone complex and a high-purity barium β-diketone complex as the metal M supply sources which each contain 1 ppm or less of each of an alkali metal and an alkaline earth metal as impurity metals.

According to the present invention, there are also provided high-purity strontium and barium β-diketone complexes which each contain 1 ppm or less of each of an alkali metal and an alkaline earth metal as impurity metals, particularly bis(dipivaloylmethanato) strontium and barium (Sr(dpm)$_2$ and Ba(dpm)$_2$) with structures represented by formula (1) above, and bis(hexafluoroacetylacetonato) strontium and barium (Sr(hfac)$_2$ and Ba(hfac)$_2$) with structures represented by formula (2) above.

The high-purity strontium or barium β-diketone complex can be prepared by reacting high-purity metallic strontium or barium, which contain an alkali metal and an alkaline earth metal as impurity metals of 1 ppm or less, with a β-diketone compound in a non-aqueous organic solvent.

In addition, the high-purity metallic strontium or barium which is used in the above reaction can be prepared by mixing high-purity strontium oxide or barium oxide, which contain an alkali metal and an alkaline earth metal as impurity metals of 1 ppm or less, with aluminum, and heating the mixture under reduced pressure to reduce the metal oxides.

Further, the high-purity strontium oxide or barium oxide which is subjected to reduction according to the process mentioned above is prepared by heat decomposition of a heat-decomposable strontium or barium compound (e.g., a nitrate) which contain an alkali metal and an alkaline earth metal as impurity metals of 1 ppm or less, through purification by combination of recrystallization and ion-exchange chromatography.

DETAILED DESCRIPTION OF THE INVENTION

The sequence of synthesis of the high-purity barium or strontium β-diketone complexes according to the present invention is exemplified, for the case of synthesis of Sr(dpm)$_2$ starting with strontium nitrate, as follows.

Strontium nitrate [Sr(NO$_3$)$_2$]
↓ Purification by recrystallization and ion-exchange chromatography
High-purity strontium nitrate [Sr(NO$_3$)$_2$]
↓ Heat decomposition
High-purity strontium oxide (SrO)
↓ Al (reducing agent)
High-purity metallic strontium
↓ dmpH
Strontium complex [Sr(dpm)$_2$]

The present invention will now be explained step by step following the sequence of synthesis illustrated above. The following description refers mainly to the case where the metal is strontium for simplicity of the description, but it also applies fully to the case where the metal is barium. In addition, since the present invention is aimed at increasing the purity, it is necessary to use the individual materials (solvents, reagents, etc.) with high purities in the operations described below, and to use equipment and an atmosphere so as to prevent the mixing of impurities resulting therefrom.

In the context of the present invention an impurity alkaline earth metal is Mg and Ca, and optionally either Sr or Ba. If the complex is a source for Sr, then Ba is an impurity alkaline earth metal. If the complex is a source for Ba, then Sr is an impurity alkaline earth metal. If the complex is a source for both Ba and Sr, as in the deposition of (Ba$_x$Sr$_{1-x}$TiO$_3$), then neither Sr nor Ba is an impurity alkaline earth metal.

The starting material in the sequence of synthesis mentioned above is a strontium compound which forms strontium oxide by heat decomposition. Illustrative embodiments of the strontium compound include inorganic compounds such as strontium nitrate, strontium carbonate and strontium hydroxide, and organic lower carboxylates such as strontium acetate and strontium propionate. These strontium compounds contain, even in cases where they are guaranteed-grade reagents, alkali metals (Li, Na and K) and alkaline earth metals (Mg, Ca and Ba) as impurities in a total amount exceeding 100 ppm, which is unacceptable as materials for dielectric thin films. Hereunder, the alkali metals and the alkaline earth metals will be collectively referred to as "impurity metals". Since the impurity metals in the starting material are brought into the vapor deposition material Sr(dpm)$_2$ without being removed, and further Sr(dpm)$_2$ is chemically so unstable as to prevent easy purification, the impurity metals are mixed into the dielectric thin films which are ultimately obtained. This mixing is the cause of impaired leakage currents and dielectric breakdown voltages of films formed by MOCVD, because alkali metals and alkaline earth metals have a great effect on the movement of charges and tend to promote generation of leakage currents and dielectric breakdown.

It may be a reasonable suggestion to remove the impurity metals by purification of the metallic strontium or the strontium oxide. However, metallic strontium is very reactive and easily react with water, oxygen, nitrogen, carbon dioxide, etc., is and therefore difficult to purify. It is also difficult to purify strontium oxide since it tends to absorb water and carbon dioxide from the air. Accordingly the impurity metals must be removed at the stage of the heat-decomposable strontium compound which is the starting material for strontium oxide.

It has been found that purification by a combination of recrystallization and ion-exchange chromatography results in removal of the impurity metals from the strontium compound to an individual metal content of 1 ppm or less, since the alkali metals are effectively removed by recrystallization, while the alkaline earth metals, which are difficult-to remove elements of the same group, are effectively removed by ion-exchange chromatography. Although there is no particular need to carry out either the recrystallization or the ion-exchange chromatography first, the recrystallization is preferably carried out first, for a lower impurity concentration, since the lifetime of the ion-exchange resin used in the ion-exchange chromatography is thereby prolonged. The purification can be carried out, for example, as follows: First, the strontium compound is dissolved in an appropriate solvent, with heating if necessary. Water can be used as the solvent when the strontium compound is a nitrate, acetate or chloride which is water-soluble. In order to prevent mixing of impurities, a substance with a high purity (e.g., ultrapure water) is used as the solvent. In cases where the strontium compound is a water-insoluble material such as an hydroxide or carbonate, nitric acid or acetic acid, for example, is used as the solvent to convert the compound into a water-soluble nitrate or acetate for dissolution.

The strontium compound, before having been dissolved for the recrystallization, and the strontium compound which is the product after the recrystallization, can be different compounds. Here, however, since the strontium compound must be prepared as a solution for subsequent ion-exchange chromatography, and the finally purified strontium compound is converted into an oxide by heat decomposition, the strontium compound recovered in the recrystallization step is preferably a water-soluble and heat-decomposable compound. Examples, include lower carboxylates such as acetate, or nitrate. Strontium chloride, which is water-soluble but not heat-decomposable, is preferably converted into a nitrate by the addition of nitric acid during the process of recrystallization. However, since the conversion requires the use of additional acid, the strontium compound is preferably a naturally water-soluble and heat decomposable compound, such as a nitrate or lower carboxylate.

The resulting strontium compound is subjected to a conventional recrystallization. For example, the compound is filtered while hot, or is subjected to heating for concentration after filtering, followed by cooling to precipitate crystals, which are recovered. Since alkali metal compounds generally have higher solubilities than alkaline earth metal compounds, the impurity alkali metals tend to remain in the solution after the recrystallization, with most of the impurity alkali metals separated from the crystals. In addition, a considerable amount of calcium can be removed, since the solubility of the calcium compounds is considerably higher than the solubility of the strontium compound. However, it is difficult to remove the Ba compound (or the Sr compound when the compound to be purified is a Ba compound) by the preceding recrystallization procedure.

In order to reduce the individual impurity metal contents to 1 ppm or less through purification by subsequent ion-exchange chromatography, it is preferred that the total content of the impurity metals be reduced to approximately 1,000 ppm or less, by recrystallization. Depending on the impurity concentrations, particularly the Ba concentration, of the raw strontium compound, it is difficult to decrease the impurity contents by recrystallization when it is performed according to the conventional recrystallization procedure described above.

To overcome this difficulty, according to a preferred embodiment of the present invention, the impurity metals can be removed by precipitation from the solution of the strontium compound by a chemical reaction. An example of the recrystallization operation which involves removal treatment of the impurity metals by precipitation will now be explained with reference to the case of strontium nitrate.

First, strontium nitrate is dissolved in water (ultrapure water) containing nitric acid. The nitric acid is present in order to stabilize the strontium nitrate during chemical reaction with sulfuric acid, described below. The solution is filtered while hot to remove any precipitate, followed by addition of a small volume of concentrated sulfuric acid to precipitate mainly impurity Ba ions as $BaSO_4$. If necessary, the solution is heated to digest the precipitate and then cooled, and then the precipitate is filtered off. Aqueous ammonia is then added to the solution to make it weakly acidic to almost neutral, and a small amount of ammonium oxalate is added to precipitate mainly impurity Ca ions as an oxalate $[Ca(C_2O_4)]$. The cooled solution, after the precipitate has been digested in the same manner as in the above case, if necessary, is filtered to remove the precipitate. The solution is then concentrated under reduced pressure, and after nitric acid has been added to prevent precipitation of materials other than the nitrate, including carbonates and hydroxides, if necessary, the solution is cooled to precipitate strontium nitrate. Finally, the precipitated crystals are recovered. The above addition of a chemical operation for removing alkaline earth metal compounds, particularly Ca and Ba compounds as precipitates, results in a decrease in the total amount of the impurity metals to 1,000 ppm or less.

The strontium compound purified by recrystallization is further purified by subsequent ion-exchange chromatography. The ion exchanger which is used for purification may be any cation-exchangeable material, such as an ion-exchange resin (cation-exchange resin) or zeolite, for example. Preferably an ion-exchange resin is used. A particularly preferred ion-exchange resin is a chelate type.

Prior to use, the ion-exchange resin (or other ion exchanger) is immersed in an aqueous solution of the same strontium compound (e.g., an aqueous solution of strontium nitrate) for sufficient time to convert the cations into Sr ions. An aqueous solution of the strontium compound purified by recrystallization is then passed through the ion-exchange resin, if necessary, under pressure. The aqueous solution which has passed through the ion-exchange resin is concentrated under reduced pressure and cooled, and precipitated crystals of the strontium compound are recovered. Alteratively, ammonium carbonate can be added to, or carbon dioxide can be bubbled through, the aqueous solution to precipitate strontium carbonate. This process produces a high-purity, heat decomposable strontium compound (e.g., a nitrate, acetate or carbonate) with the impurity content of individual metals reduced to 1 ppm or less.

The high-purity strontium compound may then be heated to decomposition, to prepare strontium oxide. The decomposition temperature is generally around 900° C., and accordingly the temperature is set to be approximately 900° C. or higher. Preferably, the heat decomposition is performed in a stream of a dry inactive gas (e.g., nitrogen gas). Furthermore, in order to complete the heat decomposition, it is preferred to perform degassing in a vacuum at approximately 900° C. in the final stage of heating. This results in a strontium oxide with the impurity content of individual metals being 1 ppm or less. Strontium oxide is very active, rapidly absorbing water and carbon dioxide from the air, and must be stored under a vacuum or in an argon-filled ampoule, or otherwise.

The high-purity strontium oxide may be reduced to metallic strontium by the thermit process using aluminum powder.

The reduction can be carried out using a reactor comprising a retort section and a condenser section compartmented with a gas-permeable partition, of the type typically used for the reduction of magnesium oxide to metallic magnesium. The strontium oxide powder is first mixed with metallic aluminum powder. The mixing ratio is preferred to be SrO:Al=3:2, the stoichiometric molar ratio. The mixture is charged into the retort section, preferably as a pellet formed by compression molding. While exhausting air from the reactor to create a reduced pressure therein, the retort section is heated to a reaction temperature (approximately 1,150° C.), whereas the condenser section is cooled. The metallic strontium produced by the reaction evaporates and reaches the condenser section through the partition, and is cooled and deposited on the wall of the condenser section. The reaction time ranges from several hours to several tens of hours depending on the size of the pellet. After the reaction has been completed, the deposited strontium is taken out from the condenser section. High-purity metallic strontium with an impurity content of individual metals being 1 ppm or less can be obtained. Since this metallic strontium is very reactive, it is stored under petroleum or in an argon-filled vessel.

A volatile strontium β-diketone complex [e.g., $Sr(dpm)_2$ or $Sr(hfac)_2$], which can be used as a vapor deposition material by MOCVD, is prepared by reacting the high-purity metallic strontium with a β-diketone (e.g., dpmH or hfacH). This reaction may be carried out by heating the metallic strontium with the β-diketone in an organic solvent, for example, a hydrocarbon such as toluene or xylene, or an aprotic solvent such as pyridine, lutidine or tetrahydrofuran. When the β-diketone is dpmH, the heating may be performed at 100°–150° C. for 6–24 hours. After the reaction has been completed, the solution is cooled, and the precipitated β-diketone complex [e.g., $Sr(dpm)_2$] is recovered by filtration. If necessary, the complex can be purified by recrystallization or sublimation. The purification provides a high-purity strontium β-diketone complex with an impurity content of individual metals being 1 ppm or less.

According to the present invention, the high-purity β-diketone complex may be used as the Sr and/or Ba supply source to form $MTiO_3$-type dielectric thin films by MOCVD. The Ti supply source used is preferably a titanium alkoxide (e.g., tetraisopropoxy titanium) with an impurity content of individual metals of 1 ppm or less, which may be prepared by recrystallization or sublimation. The formation of the films by MOCVD can be carried out under the same conditions as the prior art. Since all the vapor deposition materials have high purities, high-purity $MTiO_3$ films with an individual impurity content of individual metals being 1 ppm or less, preferably 100 ppb or less, can be formed.

The formed films may be heat treated (e.g., at 500°–650° C. for 0.5–5 hours) in a conventional manner to increase the crystallinity. Since the films have high purities, a minimized amount of impurity metals are precipitated in the grain boundary during heat treatment. As a result, the dielectric thin films with perovskite-type crystal structures have greatly reduced leakage currents and increased dielectric breakdown voltages. The electric characteristics of the thin films are exemplified by a leakage current of approximately $10^{-8}$ A/cm$^2$ ($5 \times 10^{-8}$ A/cm$^2$ or less), a relative dielectric constant of 120 or greater, preferably 150 or greater, and a dielectric breakdown voltage (film thickness: 3,000 Å) of 1,500 kV/cm$^2$ or higher, in the case of films of strontium titanate ($SrTiO_3$); and a leakage current of approximately $10^{-8}$ A/cm$^2$ ($5 \times 10^{-8}$ A/cm$^2$ or less), a relative dielectric constant of 200 or greater, and a dielectric breakdown voltage (film thickness: 3,000 Å) of 1,400 kV/cm$^2$ or higher, in the case of strontium barium titanate ($Ba_xSr_{1-x}TiO_3$).

Having generally described this invention, a further understanding can be obtained by reference to certain specific examples which are provided herein for purposes of illustration only and are not intended to be limiting unless otherwise specified.

EXAMPLES

The effects of the present invention will now be demonstrated with the Examples which follow. In the Examples, impurity alkali metals were analyzed by atomic absorption analysis, impurity alkaline earth metals and impurity heavy metals (Fe and Ni) by ICP emission spectral analysis, and U and Th by flameless emission spectral analysis.

Example 1

(A) Preparation of high-purity strontium nitrate (1) Recrystallization

A 100-g portion of commercially available guaranteed-grade strontium nitrate [$Sr(NO_3)_2$] was added to and dissolved in 100 g of ultrapure water. The resulting solution was boiled and filtered while hot, and the filtrate was allowed to cool to room temperature. A 20-ml portion of ethanol was added to the filtrate which was then allowed to stand in a refrigerator overnight. The precipitated white needle crystals were filtered off to recover 75 g of strontium nitrate.

(2) Ion-exchange chromatography

CR-10, a chelate-type cation-exchange resin manufactured by Mitsubishi Chemical Corporation, was used. The resin was pretreated by immersion in a 30% aqueous solution of strontium nitrate at room temperature for 3 hours to exchange Na ions in the resin with Sr ions. The resin was charged into three column-chromatographic columns 100 mm in diameter and 1.5 m in length, which were then connected in series with TEFLON tubes.

A 50-g portion of the strontium nitrate recrystallized as described above was dissolved in 100 g of ultrapure water, and the resulting aqueous solution was forced into the first column at a flow rate of 0.4 l/hr. with a solvent pump to pass through the chelate resin. The aqueous solution, which flowed out of the last column after passage, was concentrated under reduced pressure with a rotary evaporator (oil bath temperature: 120°–130° C.). The concentrating was stopped when a white precipitate was formed, and the solution was then allowed to cool to room temperature. A 140-g portion of electronics industry-use chemical-grade nitric acid (specific gravity: 1.38) was added to the solution which was then allowed to stand in a refrigerator overnight. The precipitated white needle crystals were filtered off to recover 40 g of high-purity strontium nitrate.

(B) Preparation of high-purity strontium oxide

A 100-g portion of the high-purity strontium nitrate purified as described above was put on an alumina board and placed in a quartz tubular furnace to be heated in a stream of nitrogen at 200° C. After the inflow of nitrogen gas was suspended, the furnace was evacuated to 0.01 Torr with a vacuum pump, and the strontium nitrate was dehydrated under reduced, pressure at 200° C. After the vacuum pump was stopped, nitrogen gas was again introduced, and the tubular furnace was heated to 900° C. The inflow of nitrogen gas was stopped after 1.5-hours of heating, and the inside of the furnace was again maintained at a reduced pressure of 0.01 Torr with the vacuum pump for 1 hour while heating at 900° C. A 46-g portion of high-purity strontium oxide (SrO) was obtained in this way.

There was no diffusion of Ca, Si or Al from the alumina board during the reaction described above, as confirmed by ICP emission spectral analysis.

(C) Preparation of high-purity metallic strontium

The high-purity strontium oxide (SrO) obtained as described above was mixed with 6N-grade Al powder (0.6 moles), and the mixture was charged into a graphite susceptor and heated in a SUS vacuum furnace at 1,000° C. to reduction. The product was distilled in a vacuum to obtain high-purity metallic strontium.

(D) Preparation of high-purity strontium β-diketone complexes [Sr(dpm)₂] and [Sr(hfac)₂].

A 2.6-g portion of the metallic strontium, purified as described above, was placed in a reactor, which had been purged with nitrogen in advance, and 30 ml of dry toluene was added thereto. An 11.8-g portion of freshly distilled dipivaloylmethane (dpmh) was added to the mixture which was then stirred. After being stirred for 30 minutes, the mixture was heated in an oil bath to 130° C. and then heated to reflux for 24 hours. The reaction solution was filtered in a stream of nitrogen, and the filtrate was evaporated to dryness under nitrogen to obtain white powdery Sr(dpm)₂. The resulting white powder was heated and dissolved in 10 ml of dry toluene, and recrystallized in a refrigerator through precipitation of crystals. The foregoing recrystallization operation was repeated two additional times. The Sr(dpm)2 was dried in a vacuum at 120° C. and 0.2 Torr and then purified by sublimation at 200° C. and 0.01 Torr, and 8.4 g of high-purity Sr(dpm)₂ was finally recovered.

Sr(hfac)₂ was synthesized in the same manner as the above, except that an equimolar amount of hexafluoroacetylacetone (hfacH) was used instead of the dpmh.

The content of impurity metals of commercially available strontium nitrate used as the starting material and the respective products obtained in the above steps (A) through (D) are listed in TABLE 1.

step (D) in Example 1 to obtain Sr(dpm)₂. Results of analysis of the used metallic strontium and the Sr(dpm)₂ product are listed in TABLE 2 given below.

TABLE 2

CONTENT OF IMPURITY METALS OF RAW MATERIALS AND PRODUCTS (PPM)

| ANALYTICAL SAMPLE | Li | Na | K | Mg | Ca | Ba | Fe | Ni | U | Th |
|---|---|---|---|---|---|---|---|---|---|---|
| Sr Metal (COMMERCIALLY AVAILABLE) | 81 | 99 | <1 | 140 | 620 | 2300 | 36 | 5 | ND* | ND |
| Sr (dpm)₂ | 60 | 61 | 10 | 81 | 850 | 800 | 6 | 2 | ND | ND |

*ND: Not Detected

Example 2

(A) Preparation of high-purity strontium nitrate (1) Recrystallization

A 71-g portion of commercially available guaranteed-grade strontium nitrate was added to 140 g of ultrapure water, and to the resulting solution there was added 57 g of electronics industry-use chemical-grade nitric acid (specific gravity:1.38). The solution was boiled and filtered while hot, and 3 ml of electronics industry-use chemical-grade concentrated sulfuric acid was added to the hot filtrate. A white precipitate was formed immediately after the addition. After the solution was directly boiled for 5 minutes, the white precipitate was digested in the hot solution maintained at 50° C. for 3 hours. The mixture was then allowed to cool to room temperature, and filtered. Approximately 35 ml of electronics industry-use chemical-grade aqueous ammonia was added to the filtrate to make it weakly acidic to acidic, and then 3 ml of a saturated aqueous solution of commercially available guaranteed-grade ammonium oxalate, which was prepared by dissolution in ultrapure water, was added to the solution which was then boiled again. A white precipitate was again produced upon the addition. The solution, after having been allowed to cool to room temperature, was

TABLE 1

CONTENT OF IMPURITY METALS OF RAW MATERIALS AND PRODUCTS (PPM)

| ANALYTICAL SAMPLE | Li | Na | K | Mg | Ca | Ba | Fe | Ni | U | Th |
|---|---|---|---|---|---|---|---|---|---|---|
| Sr(NO₃)₂ (COMMERCIALLY AVAILABLE) | 2 | 90 | 2 | 1.1 | 40 | 840 | 2 | 2 | ND* | ND |
| Sr(NO₃)₂ (AFTER RECRYSTALLIZATION) | <1 | 5 | <0.5 | <0.5 | 4 | 800 | <0.5 | <0.5 | ND | ND |
| Sr(NO₃)₂ (AFTER ION EXCHANGE) | <0.3 | <0.3 | <0.3 | <0.3 | <0.5 | <1 | <0.2 | <0.2 | ND | ND |
| SrO | <0.5 | <0.5 | <0.5 | <0.5 | <0.5 | <1 | <0.5 | <0.5 | ND | ND |
| Sr METAL | <1 | <1 | <1 | <1 | <1 | <1 | <1 | <1 | ND | ND |
| Sr (dpm)₂ | <1 | <1 | <1 | <1 | <1 | <1 | <1 | <1 | ND | ND |
| Sr (hfac)₂ | <1 | <1 | <1 | <1 | <1 | <1 | <1 | <1 | ND | ND |

*ND: Not Detected

Comparative Example 1

Commercially available 2N-grade metallic strontium was used for reaction and purification in the same manner as in filtered, and the filtrate was concentrated under reduced pressure with a rotary evaporator (oil bath temperature: 120°–130° C.). The concentrating was stopped when a white precipitate was formed, and the solution was then allowed to cool to room temperature. A 140-g portion of electronics industry-use chemical-grade nitric acid (specific gravity: 1.38) was then added to the solution, which was then allowed to stand in a refrigerator overnight. The precipitated white needle crystals were filtered off to recover 50 g (yield: about 70%) of high-purity strontium nitrate.

(2) Ion-exchange chromatography

A 50-g portion of the strontium nitrate purified by recrystallization as described above was further purified by ion-exchange chromatography in the same manner as described in step (A)-(2) in Example 1, to recover 40 g of a purification product.

(B)–(D)

The high-purity strontium nitrate obtained in step (A) above was used to synthesize strontium oxide, metallic strontium and Sr(dpm)$_2$ in the same manner as in steps (B)–(D) in Example 1. Results of analysis of the raw materials and the products or purification products in the respective steps are listed in TABLE 3, below.

stand in a refrigerator overnight. The precipitated white needle crystals were filtered off to recover 38 g of strontium acetate.

(B) Preparation of high-purity strontium oxide

A 50-g portion of the high-purity strontium acetate purified by recrystallization alone as described above was put on an alumina board and placed in a quartz tubular furnace to be heated in a stream of nitrogen at 200° C. After the inflow of nitrogen gas was suspended, the furnace was evacuated to 0.01 Torr with a vacuum pump, and the strontium acetate was dehydrated under reduced pressure at 200° C. After the vacuum pump was stopped, nitrogen gas was again introduced, and the tubular furnace was heated to 900° C. The inflow of nitrogen gas was stopped after a 0.5-hour heating, hydrogen gas was introduced into the tubular furnace which was heated to 1,200° C. The inside of the furnace was again maintained at a reduced pressure of 0.01 Torr with the vacuum pump for 1 hour at that temperature. A 23-g portion of high-purity strontium oxide (SrO) was obtained in this way.

There was no diffusion of Ca, Si or Al from the alumina board during the reaction described above, as confirmed by ICP emission spectral analysis.

TABLE 3

CONTENT OF IMPURITY METALS OF RAW MATERIALS AND PRODUCTS (PPM)

| ANALYTICAL SAMPLE | Li | Na | K | Mg | Ca | Ba | Fe | Ni | U | Th |
|---|---|---|---|---|---|---|---|---|---|---|
| Sr(NO$_3$)$_2$ (COMMERCIALLY AVAILABLE) | 2 | 90 | 2 | 1.1 | 40 | 840 | 2 | 2 | ND* | ND |
| Sr(NO$_3$)$_2$ (AFTER RECRYSTALLIZATION) | <1 | 1 | <0.5 | <0.5 | 1 | 50 | <0.5 | <0.5 | ND | ND |
| Sr(NO$_3$)$_2$ (AFTER ION EXCHANGE) | <0.3 | <0.3 | <0.3 | <0.3 | <0.5 | <1 | <0.2 | <0.2 | ND | ND |
| SrO | <0.5 | <0.5 | <0.5 | <0.5 | <1 | <1 | <0.5 | <0.5 | ND | ND |
| Sr METAL | <1 | <1 | <1 | <1 | <1 | <1 | <1 | <1 | ND | ND |
| Sr (dpm)$_2$ | <1 | <1 | <1 | <1 | <1 | <1 | <1 | <1 | ND | ND |

*ND: Not Detected

Comparative Example 2

(A) Preparation of high-purity strontium acetate (1) Recrystallization

A 50-g portion of commercially available guaranteed-grade strontium acetate [Sr(OAc)$_2$] was added to and dissolved in 100 g of ultrapure water. The resulting solution was boiled and filtered while hot, and the filtrate was allowed to cool to room temperature. A 20-ml portion of ethanol was added to the filtrate which was then allowed to (C)–(D)

The high-purity strontium oxide obtained in step (B) above was used to synthesize metallic strontium and Sr(dpm)$_2$ in the same manner as in steps (C)–(D) in Example 1. Results of analysis of the raw materials and the products or purification products in the respective steps are listed in TABLE 4 given below. The impurity contents could not be reduced to 1 ppm or less in cases where the strontium acetate was purified by recrystallization alone.

TABLE 4

CONTENT OF IMPURITY METALS OF RAW MATERIALS AND PRODUCTS (PPM)

| ANALYTICAL SAMPLE | Li | Na | K | Mg | Ca | Ba | Fe | Ni | U | Th |
|---|---|---|---|---|---|---|---|---|---|---|
| Sr(OAc)$_2$ (COMMERCIALLY AVAILABLE) | 2 | 31 | 0.2 | 1 | 100 | 700 | 0.5 | 0.2 | ND* | ND |
| Sr(OAc)$_2$ (AFTER RECRYSTALLIZATION) | <1 | <0.1 | 0.2 | <0.1 | 90 | 100 | <0.5 | <0.1 | ND | ND |
| SrO | <0.3 | <0.3 | <0.3 | <0.3 | 40 | 23 | <0.3 | <0.3 | ND | ND |
| Sr METAL | <1 | <1 | <1 | <1 | 51 | 29 | <1 | <1 | ND | ND |
| Sr (dpm)$_2$ | <1 | <1 | <1 | <1 | 10 | 23 | <1 | <1 | ND | ND |

*ND: Not Detected

Example 3

(A) Preparation of high-purity strontium acetate (1) Recrystallization

A 50-g portion of commercially available guaranteed-grade strontium acetate was added to 100 g of ultrapure water, and to the resulting solution there was added 80 g of commercially available guaranteed-grade glacial acetic acid. The solution was boiled and filtered while hot, and 3 ml of electronics industry-use chemical grade concentrated sulfuric acid was added to the hot filtrate. A white precipitate was formed immediately after the addition. After the solution was directly boiled for 5 minutes, the white precipitate was digested in the hot solution maintained at 50° C. for 6 hours. The mixture was then allowed to cool to room temperature, and filtered. Approximately 35 ml of electronics industry-use chemical grade aqueous ammonia was added to the filtrate to make it weakly acidic to acidic, and after this 3 ml of a saturated aqueous solution of commercially available guaranteed-grade ammonium oxalate, which was prepared by dissolution in ultrapure water, was added to the solution which was then boiled again. A white precipitate was again produced upon the addition. The solution, after having been allowed to cool to room temperature, was filtered, and the filtrate was concentrated under reduced pressure with a rotary evaporator (oil bath temperature: 120°–130° C.). The concentrating was stopped when a white precipitate was formed, and the solution was then allowed to cool to room temperature. A 10-g portion of commercially available guaranteed-grade glacial acetic acid was then added to the solution which was then allowed to stand in a refrigerator overnight. The precipitated white needle crystals were filtered off to recover 42 g of high-purity strontium acetate.

(2) Ion-exchange chromatography

A 40-g portion of the strontium acetate purified by recrystallization as described above was further purified by ion-exchange chromatography in the same manner as described in step (A)-(2) in Example 1 to recover 31 g of a purification product.

(B)–(D)

The high-purity strontium acetate obtained in step (A) above was used to synthesize strontium oxide, metallic strontium and $Sr(dpm)_2$ as described in steps (B)–(D) in Example 1. Results of analysis of the raw materials and the products or purification products in the respective steps are listed in TABLE 5, below.

Example 4

The $Sr(dpm)_2$ obtained in each of Examples 1–3 and Comparative Example 1 and tetraisopropoxy titanium $Ti(i-OPr)_4$ purified twice by distillation under reduced pressure were used to prepare films of $SrTiO_3$ by MOCVD under the following conditions:

Substrate: $Pt/Ti/SiO_2/Si$

Substrate temperature: 600° C.

$Sr(dpm)_2$: Vaporization temperature, 180° C. Carrier gas, $N_2$ at 200 ccm $Ti(i-OPr)_4$: Vaporization temperature, 40° C. Carrier gas, $N_2$ at 50 ccm Oxygen flow: 500 ccm Pressure: 3 Torr The films (film thickness: 1,500 Å) were heat treated by heating in air at 650° C. for 30 minutes. The composition of each of the heat-treated films was confirmed as having a stoichiometric ratio when observed by quantitative analysis using EPMA (X-ray electron probe microanalysis). Analysis of impurities of the films by flameless emission spectral analysis and ICP emission spectral analysis revealed that each alkali metal or alkaline earth metal of the films formed using the $Sr(dpm)_2$ synthesized in Examples 1–3 was present in an amount of 10 ppb or less. On the other hand, films obtained by using the $Sr(dpm)_2$ synthesized in Comparative Example 1 had a total content of alkali metals and alkaline earth metals of 380 ppm.

Pt electrodes were fabricated by sputtering on the prepared dielectric thin films to examine their electronic characteristics, with the results shown in TABLE 6, below.

TABLE 5

CONTENT OF IMPURITY METALS OF RAW MATERIALS AND PRODUCTS (PPM)

| ANALYTICAL SAMPLE | Li | Na | K | Mg | Ca | Ba | Fe | Ni | U | Th |
|---|---|---|---|---|---|---|---|---|---|---|
| $Sr(OAc)_2$ (COMMERCIALLY AVAILABLE) | 2 | 90 | 2 | 1.1 | 48 | 840 | 2 | 2 | ND* | ND |
| $Sr(OAc)_2$ (AFTER RECRYSTALLIZATION) | <1 | <0.1 | <0.1 | <0.1 | 30 | 40 | <0.5 | <0.1 | ND | ND |
| $Sr(OAc)_2$ (AFTER ION EXCHANGE) | <0.1 | <0.1 | <0.1 | <0.1 | <160 | <1 | <0.2 | <0.1 | ND | ND |
| SrO | <0.3 | <0.3 | <0.3 | <0.3 | <1 | <1 | <0.5 | <0.5 | ND | ND |
| Sr METAL | <1 | <1 | <1 | <1 | <1 | <1 | <1 | <1 | ND | ND |
| $Sr(dpm)_2$ | <1 | <1 | <1 | <1 | <1 | <1 | <1 | <1 | ND | ND |

*ND: Not Detected

TABLE 6

| PREP. METHOD OF Sr(DPM)$_2$ | RELATIVE DIELECTRIC CONSTANT ($\epsilon$) | DIELECTRIC LOSS (tan $\delta$) | LEAKAGE CURRENT DENSITY (A/cm$^2$) | DIELECTRIC BREAKDOWN VOLTAGE[1] kV/cm$^2$ |
|---|---|---|---|---|
| EXAMPLE 1 | 260 | <0.01 | 3 × 10$^{-8}$ | 1600 |
| COMP. EXAMPLE 1 | 150 | 0.02 | 2 × 10$^{-7}$ | 1000 |
| EXAMPLE 2 | 248 | <0.01 | 1 × 10$^{-8}$ | 1400 |
| COMP. EXAMPLE 2 | 130 | 0.02 | 1 × 10$^{-7}$ | 1050 |
| EXAMPLE 3 | 195 | <0.01 | 2 × 10$^{-8}$ | 1700 |

[1]Film thickness: 3,000 Å

As described above, the present invention allows preparation of high-purity strontium and barium β-diketone complexes which each contain 1 ppm or less of each alkali metal and alkaline earth metal as impurity metals, by purification of the ultimate raw materials, by a combination of recrystallization and ion-exchange chromatography. Use of the complexes as the vapor deposition materials for preparation of MTiO$_3$-type dielectric thin films by MOCVD provides dielectric thin films with a much lower impurity content, much smaller leakage currents and increased dielectric breakdown voltages. In addition, since the U and Th contents are decreased as well, the dielectrics prepared according to the present invention present fewer troublesome software errors due to α-rays when they are used as capacitor films of DRAMs. In conclusion, it is believed that the present invention has established a reliable industrial method of preparing high-performance MTiO$_3$-type dielectric thin films.

Having now fully described the invention, it will be apparent to one of ordinary skill in the art that many changes and modifications can be made thereto without departing from the spirit or scope of the invention as set forth herein.

The prioirty document of the present application, Japanese patent application HEI 7-230452, filed on Sep. 7, 1995, is incorporated herein by reference.

What is claimed is:

1. A method for preparing a film comprising depositing MtiO$_3$, wherein M is Ba, Sr or a mixture thereof, by organic chemical vapor deposition ujsing a β-diketone complex of Ba, Sr or a mixture thereof, said β-diketone complex comprising at most 1 ppm each of alkali metal and impurtity alkaline metal, the Ba and/or Sr β-diketone complex being obtained by a) purifying by recrystallization and ion-exchange chromatography a barium or strontium compound, b) decomposing the barium or strontium compound to form barium oxide or strontium oxide, c) reducing barium oxide or strontium oxide to barium metal or strontium metal in the presence of aluminum, and d) reacting barium metal and/or strontium metal with a β-diketone compound in an organic solvent to form the Ba and/or Sr β-diketone complex.

2. The method of claim 1, wherein said β-diketone complex is selected from the group consisting of bis (dipivaloylmethanato) strontium, bis(dipivaloylmethanato) barium, bis(hexafluoroacetylacetonato) strontium, bis (hexafluoroacetylacetonato) barium and mixtures thereof.

3. The method of claim 1, wherein said β-diketone complex comprises at most 100 ppb of each alkali metal and each impurity alkaline earth metal.

* * * * *